(12) United States Patent
Yonemoto et al.

(10) Patent No.: US 10,818,983 B2
(45) Date of Patent: Oct. 27, 2020

(54) BATTERY MANAGEMENT DEVICE AND SYSTEM, AND HYBRID VEHICLE CONTROL SYSTEM FOR UTILIZING BATTERY PERFORMANCE WHILE MAINTAINING BATTERY LIFE

(71) Applicant: HITACHI AUTOMOTIVE SYSTEMS, LTD., Ibaraki (JP)

(72) Inventors: Masahiro Yonemoto, Tokyo (JP); Kei Sakabe, Tokyo (JP); Takanori Yamazoe, Tokyo (JP); Shin Yamauchi, Tokyo (JP); Keiichiro Ohkawa, Hitachinaka (JP); Ryohhei Nakao, Hitachinaka (JP)

(73) Assignee: VEHICLE ENERGY JAPAN, INC., Ibaraki (JP)

( * ) Notice: Subject to any disclaimer, the term of this patent is extended or adjusted under 35 U.S.C. 154(b) by 142 days.

(21) Appl. No.: 15/743,979

(22) PCT Filed: Aug. 8, 2016

(86) PCT No.: PCT/JP2016/073225
§ 371 (c)(1),
(2) Date: Jan. 11, 2018

(87) PCT Pub. No.: WO2017/038387
PCT Pub. Date: Mar. 9, 2017

(65) Prior Publication Data
US 2018/0358663 A1 Dec. 13, 2018

(30) Foreign Application Priority Data

Sep. 1, 2015 (JP) .................................. 2015-171995

(51) Int. Cl.
*H02J 7/00* (2006.01)
*B60W 20/13* (2016.01)
(Continued)

(52) U.S. Cl.
CPC ............. *H01M 10/48* (2013.01); *B60L 50/16* (2019.02); *B60L 50/60* (2019.02); *B60L 53/00* (2019.02);
(Continued)

(58) Field of Classification Search
CPC ................. H01M 10/48; H01M 10/44; H01M 2010/4271; B60L 58/16; B60L 58/10;
(Continued)

(56) References Cited

U.S. PATENT DOCUMENTS 6,586,940 B2 * 7/2003 Asakura .................. H02M 3/07
324/426
8,336,651 B2 * 12/2012 Nishi ...................... B60K 6/445
180/65.29
(Continued)

FOREIGN PATENT DOCUMENTS

JP 2011-189768 A 9/2011
JP 2013-181875 A 9/2013
(Continued)

OTHER PUBLICATIONS

JP2011189768 English Machine Translation.*
(Continued)

*Primary Examiner* — Richard Isla
*Assistant Examiner* — Manuel Hernandez
(74) *Attorney, Agent, or Firm* — Volpe Koenig

(57) ABSTRACT

Provided is a battery management device capable of effectively utilizing battery performance while securing battery life. The battery management device includes: a divergence amount calculation unit that calculates a divergence amount between a life target value or a degradation amount target value of a storage battery, which is a secondary battery, and a life prediction value or a degradation amount prediction value according to use history of the storage battery in an
(Continued)

arbitrary period; and a limit value change unit that changes charge/discharge limit values for controlling degradation of the storage battery based on the divergence amount. The limit value change unit includes a first limit value calculation unit that calculates a first limit value set that is a combination of the charge/discharge limit values for each of a plurality of types of control parameters that change in correlation with each other based on the divergence amount.

11 Claims, 14 Drawing Sheets

(51) Int. Cl.
*H01M 10/48* (2006.01)
*G01R 31/36* (2020.01)
*B60L 53/00* (2019.01)
*B60L 50/16* (2019.01)
*B60L 58/10* (2019.01)
*B60L 58/16* (2019.01)
*B60L 50/60* (2019.01)
*B60L 53/53* (2019.01)
*H01M 10/0525* (2010.01)
*H01M 10/42* (2006.01)

(52) U.S. Cl.
CPC .............. *B60L 53/53* (2019.02); *B60L 58/10* (2019.02); *B60L 58/16* (2019.02); *B60W 20/13* (2016.01); *G01R 31/36* (2013.01); *H01M 10/0525* (2013.01); *H01M 10/425* (2013.01); *H02J 7/00* (2013.01); *H02J 7/0077* (2013.01); *H02J 7/00712* (2020.01); *H01M 2010/4271* (2013.01); *H02J 7/005* (2020.01); *Y02T 10/6221* (2013.01); *Y02T 10/6239* (2013.01); *Y02T 10/7005* (2013.01); *Y02T 10/7077* (2013.01); *Y02T 90/14* (2013.01)

(58) Field of Classification Search
CPC . B60L 53/00; H02J 7/0077; H02J 7/00; H02J 7/00712; H02J 7/005; B60W 20/13

USPC .................................................. 320/134, 136
See application file for complete search history.

(56) References Cited

U.S. PATENT DOCUMENTS

| | | | | |
|---|---|---|---|---|
| 9,720,478 | B2* | 8/2017 | Hanafusa | H01M 10/48 |
| 2007/0182373 | A1* | 8/2007 | Sakakibara | H01M 10/44 320/115 |
| 2010/0033132 | A1* | 2/2010 | Nishi | B60K 6/365 320/136 |
| 2011/0127958 | A1* | 6/2011 | Ishishita | B60W 20/13 320/109 |
| 2012/0283902 | A1* | 11/2012 | Kusumi | B60K 6/46 701/22 |
| 2015/0255998 | A1* | 9/2015 | Hasegawa | B60L 58/16 320/107 |
| 2015/0256003 | A1* | 9/2015 | Yonetani | B60L 58/16 320/150 |
| 2016/0028254 | A1* | 1/2016 | Honoki | H01M 10/44 320/162 |
| 2016/0190833 | A1* | 6/2016 | Roumi | H02J 7/00 320/136 |
| 2017/0282745 | A1* | 10/2017 | Kawamura | H02J 7/0021 |
| 2019/0361076 | A1* | 11/2019 | Koyamada | H01M 10/0562 |

FOREIGN PATENT DOCUMENTS

| | | |
|---|---|---|
| JP | 2013-240236 A | 11/2013 |
| WO | 2007-323999 A | 12/2007 |

OTHER PUBLICATIONS

JP2013181875 English Machine Translation.*
International Search Report for WO 2017/038387 A1, dated Nov. 15, 2016.
Extended European Search Report dated Apr. 4, 2019 for European Patent Application No. 16841419.1.

* cited by examiner

BATTERY MANAGEMENT DEVICE AND SYSTEM, AND HYBRID VEHICLE CONTROL SYSTEM FOR UTILIZING BATTERY PERFORMANCE WHILE MAINTAINING BATTERY LIFE

TECHNICAL FIELD

The present invention relates to a battery management device for a secondary battery, a battery system, and a hybrid vehicle control system.

BACKGROUND ART

A battery price of an onboard lithium ion secondary battery, installed in a hybrid electric vehicle (HEV) and a plug-in hybrid electric vehicle (PHEV) occupies a large proportion to vehicle price. When battery life expires earlier than vehicle life, cost for replacement of the battery occurs. Thus, it is required to control such that the battery life should not be shorter than the vehicle life. A hybrid control system that controls an input/output current of the onboard lithium ion secondary battery controls a charge/discharge current based on a state parameter of a battery output from a battery management device and a limit value of a battery load.

In PTL 1, maximum temperature of a battery and a central value of a charge rate of charge/discharge are controlled according to a magnitude of a degradation degree of the battery, thereby suppressing degradation of the battery.

CITATION LIST

Patent Literature

PTL 1: Japanese Patent Application Laid-Open No. 2013-240236

SUMMARY OF INVENTION

Technical Problem

Conventionally, it is possible to secure the battery life with respect to users with driving tendencies where magnitudes of battery loads vary, but there is a disadvantage that it is difficult to maximally release a limit value on battery performance with a stable value so that the battery performance is not sufficiently utilized.

Solution to Problem

A battery management device according to the invention of claim 1 includes: a divergence amount calculation unit that calculates a divergence amount between a life target value or a degradation amount target value of a secondary battery, and a life prediction value or a degradation amount prediction value according to use history of the secondary battery in an arbitrary period from the past to the present; and a limit value change unit that changes a charge/discharge limit value for controlling degradation of the secondary battery based on the divergence amount calculated by the divergence amount calculation unit. The limit value change unit includes a first limit value calculation unit that calculates a first limit value set, obtained by combining the charge/discharge limit values, respectively, for a plurality of types of control parameters each of which changes in correlation with each other, based on the divergence amount.

A battery system according to the invention of claim 10 includes: the battery management device according to claim 1 or 2; a secondary battery that is managed by the battery management device; and a charge/discharge control unit that controls a charge/discharge current of the secondary battery based on the first limit value set calculated by the limit value change unit.

A battery system according to the invention of claim 11 includes: the battery management device according to claim 3; a secondary battery that is managed by the battery management device; and a charge/discharge control unit that controls a charge/discharge current of the secondary battery based on the first limit value set or the second limit value set calculated by the limit value change unit.

A battery system according to the invention of claim 12 includes: the battery management device according to claim 4 or 5; a secondary battery that managed by the battery management device; and a charge/discharge control unit that controls a charge/discharge current of the secondary battery based on the charge/discharge limit value selected by the selection circuit.

A hybrid vehicle control system according to the invention of claim 13 includes: an engine and a motor provided via a power split mechanism; and the battery system according to any one of claims 10 to 12, and controls each driving force distribution of the engine and the motor according to the control of the charge/discharge current performed by the charge/discharge control unit.

Advantageous Effects of Invention

According to the present invention, the limit value on the battery performance is released as much as possible with the stable value while securing the battery life with respect to the users having different magnitudes of battery loads, and the battery performance can be effectively utilized.

DESCRIPTION OF EMBODIMENTS

Hereinafter, modes for carrying out the present invention will be described with reference to the drawings.

First Embodiment

Figure 1:
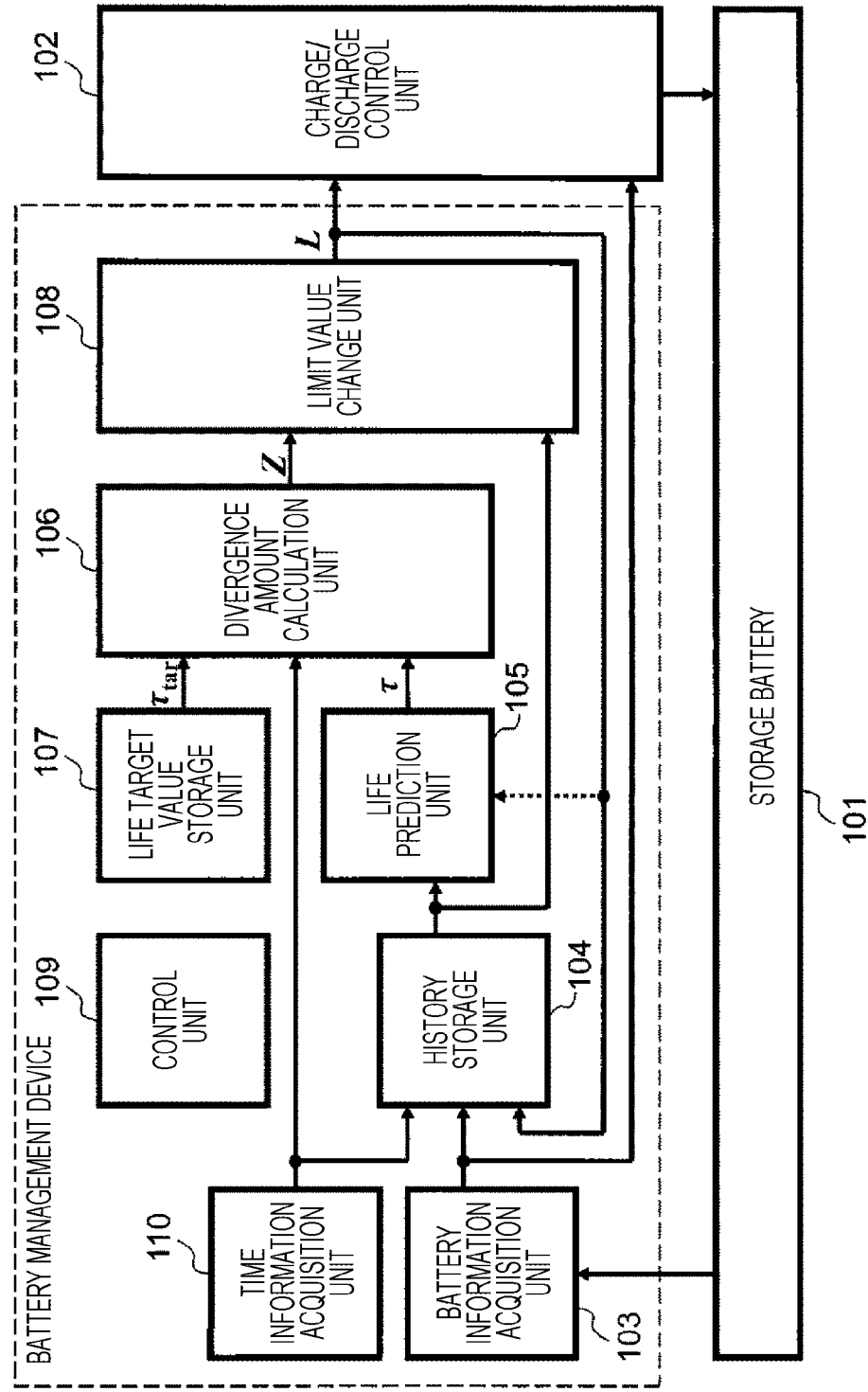
FIG. 1 is a diagram illustrating a first embodiment of a battery system according to the present invention.
Figure 2:
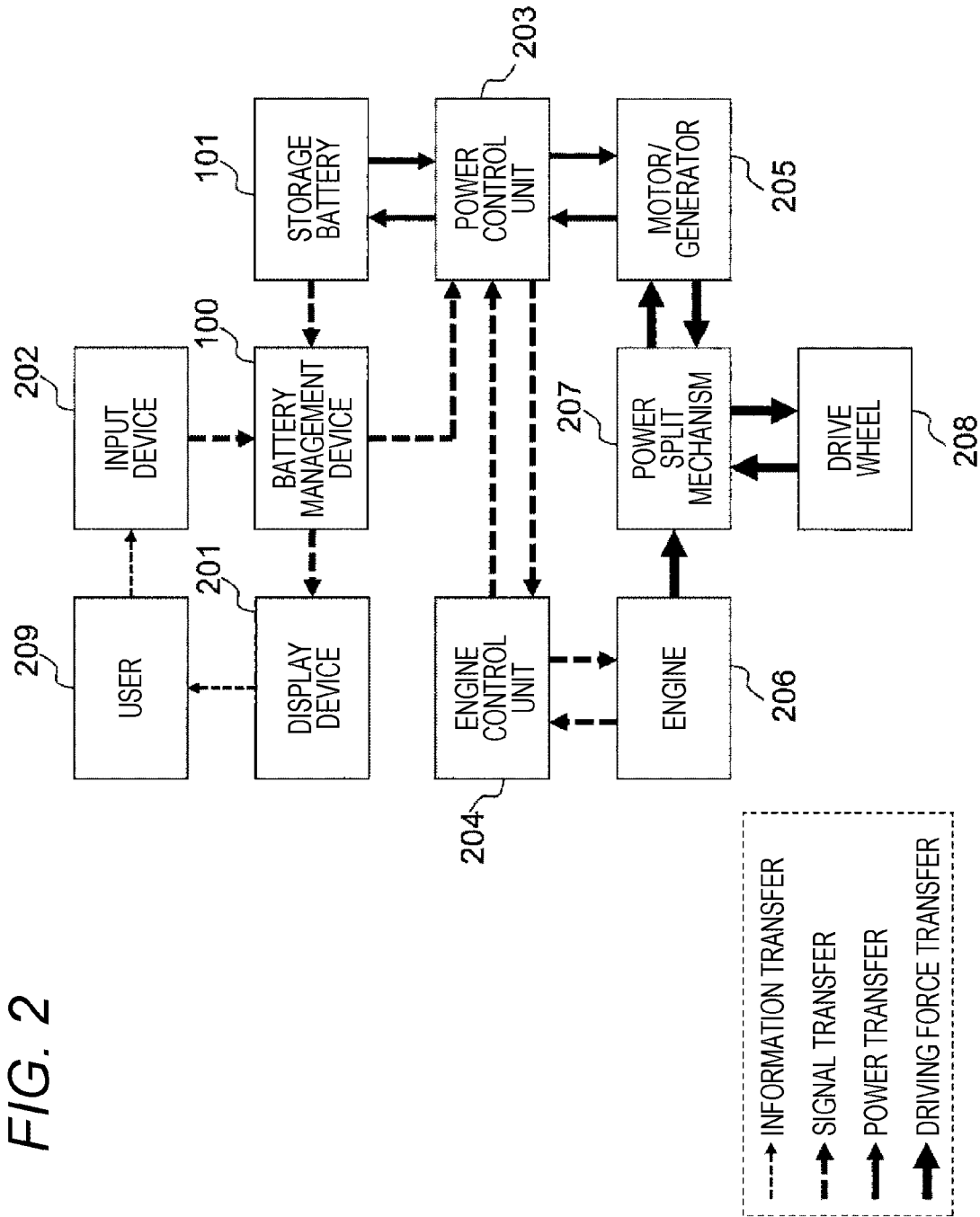
FIG. 2 is a diagram illustrating an example of a hybrid vehicle control system.

FIGS. 1 and 2 are diagrams for describing a first embodiment of a battery management device according to the present invention. A battery system of the present embodiment is mounted on a hybrid vehicle, for example, an HEV or a PHEV. FIG. 1 is a block diagram illustrating a minimum configuration of a battery system 1. The battery system 1 includes a battery management device 100, a storage battery 101, and a charge/discharge control unit 102. The storage battery 101 includes a plurality of electricity storage elements (for example, lithium ion secondary battery cells).

The battery management device 100 includes a battery information acquisition unit 103, a history storage unit 104, a life prediction unit 105, a divergence amount calculation unit 106, a life target value storage unit 107, a limit value change unit 108, a control unit 109, and a time information acquisition unit 110. The control unit 109 controls the entire management device. Incidentally, the broken-line arrows are processes relating to a third embodiment to be described later, and a description thereof will be omitted in the present embodiment. The battery information acquisition unit 103 calculates battery state parameters, such as a voltage, a state of charge (SOC), a current, temperature, and a battery degradation state (SOH: state of health) at a current timing based on sensor measurement information from a voltage sensor, a current sensor, a temperature sensor, and the like attached to the storage battery 101 or the periphery thereof. In addition, these battery state parameters are output to the charge/discharge control unit 102 and the history storage unit 104.

The history storage unit 104 stores time information relating to an arbitrary timing or an arbitrary period from the past to the present, past battery state parameters or user's use tendency associated with the time information, and a representative value of history information such as an instantaneous value, an average value, a maximum value, a minimum value, and a histogram value at a past charge/discharge limit value, and stores a result of the calculation in a storage medium (not illustrated) such as a volatile memory or a nonvolatile memory. The life prediction unit 105 predicts a life prediction value $\tau$ until reaching a degradation amount target value at a life target value timing based on the representative value of the history information stored in the history storage unit 104 and a current limit value on the battery performance.

Here, the limit values on the battery performance is a control parameter that represent an allowable charge/discharge current value which is an upper limit value of a current that can flow through the storage battery 101, an allowable charge/discharge power which is an upper limit value of power that can be input to and output from the storage battery 101, an SOC operation range of the storage battery 101, a temperature operation range of the storage battery 101, and the like. The battery management device 100 outputs these limit values to the charge/discharge control unit 102.

In addition, the life target value is a timing at which a predetermined use period has elapsed from the start of using the battery, for example, a timing at which a life guarantee period of the storage battery 101 expires, a timing at which a life guarantee period of the battery system 1 including the storage battery 101 expires, a timing at which a life guarantee period of a vehicle on which the battery system 1 is mounted expires, or the like. In addition, the life target value may be a timing at which a time limit obtained by including a margin in such life guarantee periods arrives. Hereinafter, the life target value will be described by exemplifying the timing of the life guarantee period of the vehicle (referred to as a vehicle life end timing).

The divergence amount calculation unit 106 calculates a divergence amount Z between the life prediction value $\tau$ until reaching the degradation amount target value output from the life prediction unit 105 and a life target value $\tau_{tar}$ until reaching the degradation amount target value. The life target value $\tau_{tar}$ is stored in advance in the life target value storage unit 107. The limit value change unit 108 changes the above-described limit values based on the calculated divergence amount Z and outputs this changed limit values to the charge/discharge control unit 102. The charge/discharge control unit 102 controls the charge/discharge current flowing through the storage battery 101 according to the limit values and the battery information (battery state parameters) output from the battery management device 100.

FIG. 2 illustrates an example of a vehicle control system of a hybrid vehicle (a hybrid vehicle control system) on which the battery management device 100 of FIG. 1 is mounted. The hybrid vehicle control system includes the battery management device 100, the storage battery 101, a display device 201 that displays a control state to a user 209, an input device 202 that enables the user 209 to operate whether or not to execute the present control, a power control unit 203, an engine control unit 204, a motor/generator 205, an engine 206, a power split device 207, and a drive wheel 208.

The allowable charge/discharge power, which is one of the limit values on the battery performance, is output from the battery management device 100 to the power control unit 203 serving as a host controller. The power control unit 203 drives and controls the motor/generator 205 based on the allowable charge/discharge power from the battery management device 100. The power control unit 203 and the engine control unit 204 exchange information with each other. The engine control unit 204 controls an operation of the engine 206.

When the allowable charge/discharge power output from the battery management device 100 becomes large, a driving force distribution of a motor at the time of driving the vehicle is increased, and a driving force distribution of an engine is decreased. On the contrary, when the allowable charge/discharge power output from the battery management device 100 becomes small, the driving force distribution of the motor at the time of driving the vehicle is decreased, and the driving force distribution of the engine is increased.

Figure 3:
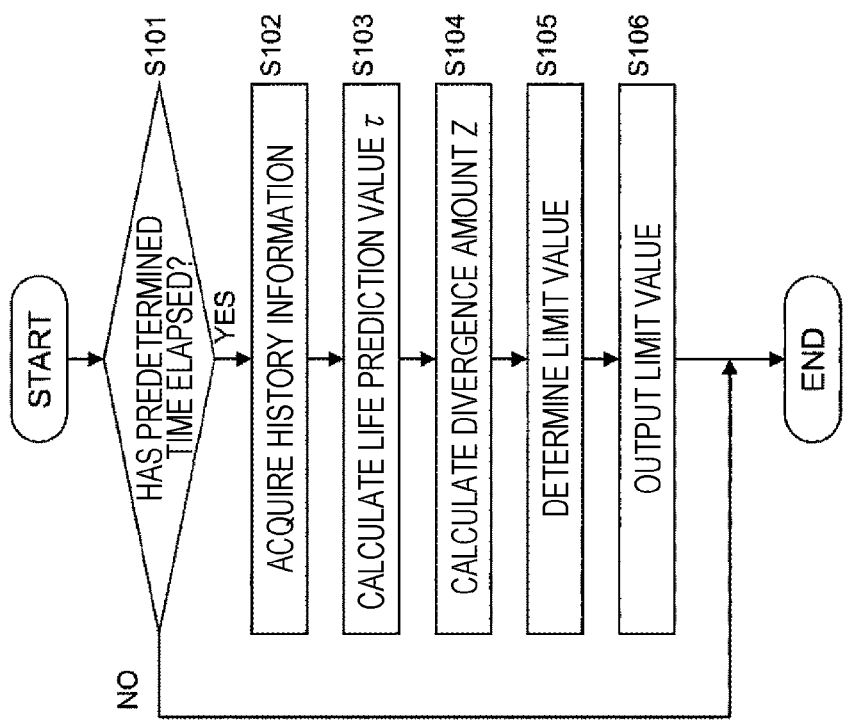
FIG. 3 is a diagram illustrating an example of a control flowchart according to the present embodiment.

FIG. 3 is a diagram illustrating an example of a control flowchart according to the present embodiment. This control program is executed by the control unit 109 in FIG. 2. A series of processes illustrated in FIG. 3 are performed at predetermined time intervals. In Step S101, it is determined whether or not a predetermined time has elapsed since the previous calculation processing, and the process is stopped if the predetermined time has not elapsed, and proceeds to Step S102 if the predetermined time has elapsed. Here, the predetermined time is a time interval representing a control period for changing the limit value according to the present invention, and, for example, a period such as a month and a year is selected therefor.

In Step S102, the history information (the representative values of the battery state parameters) is acquired from the history storage unit 104. In Step S103, the life prediction value until reaching the predetermined degradation amount is calculated by a prediction method to be described later. In Step S104, the divergence amount Z between the calculated life prediction value and the life target value $\tau_{tar}$ stored in the life target value storage unit 107 is calculated. In Step S105, the limit values on the battery performance are determined based on the calculated divergence amount Z and the representative values of the history information described above. In Step S106, the determined limit values are output to the charge/discharge control unit 102.

Next, an example of a method of calculating the life prediction value $\tau$ in the life prediction unit 105 will be described. The life Prediction unit 105 calculates either a life prediction value until reaching a predetermined degradation amount target value or a degradation amount prediction value at a predetermined life target value, and an example of a method for calculating the life prediction value until reaching the predetermined degradation amount target value will be described hereinafter. Here, it is assumed that a degradation behavior of a battery capacity Q follows the root law of time, and a function such as the following Formula (1) is used for prediction of the battery capacity Q. In Formula (1), $Q_{ini}$ is an initial capacity of the battery, D is a degradation amount, t is an elapsed time, and is a degradation progression rate. The degradation progression rate is defined as the amount of change of a degradation progression degree X per unit time when a portion in the root in Formula (1) is defined as the degradation progression degree X as in Formula (2), and does not take a negative value since the degradation progression degree is a physical quantity representing the degree of degradation progression. In addition, the degradation progression rate X is a value based on a user's use tendency U, a limit value L in charge/discharge of the battery, and battery specification S. When being transformed with respect to the degradation amount D(t) at a certain future timing t, Formula (2) is expressed by a current timing $t_0$, a current degradation amount $D(t_0)$, a degradation progression rate k from the current timing $t_0$ to a certain timing in the future as in Formula (3).

[Formula 1]

$$Q(t) = Q_{ini} - D(t) \quad (1)$$
$$= Q_{ini} - \sqrt{\int_0^t k(U(t), L(t), S) \cdot dt}$$

$$X(t) = \int_0^t k(U(t), L(t), S) \cdot dt = (D(t))^2 \quad (2)$$

$$D(t) = \sqrt{\int_0^t k(U(t), L(t), S) \cdot dt} \quad (3)$$
$$= \sqrt{\int_0^{t_0} k(U(t), L(t), S) \cdot dt + \int_{t_0}^t k(U(t), L(t), S) \cdot dt}$$
$$= \sqrt{(D(t_0))^2 + \int_{t_0}^t k(U(t), L(t), S) \cdot dt}$$

At this time, when an average value of future degradation progression rate from the current timing $t_0$ to the certain future timing t is defined as $k_{future}$ as shown in Formula (4), the degradation amount at the timing t can be expressed as Formula (5). In addition, when $\tau_{tar}$ is substituted for the timing t, a degradation amount prediction value $D(\tau_{tar})$ at the timing of the life target value $\tau_{tar}$ can be obtained as shown in Formula (6). In addition, when Formula (5) is transformed with respect to the timing t, the timing t can be expressed as Formula (7). When a predetermined degradation amount $D_{tar}$ is substituted for the degradation amount D in Formula (7), the timing t until reaching the predetermined degradation amount $D_{tar}$ that is, the life prediction value $\tau$ is obtained as in Formula (8).

[Formula 2]

$$k_{future} = \frac{\int_{t_0}^t k(U(t), L(t), S) \cdot dt}{t - t_0} \quad (4)$$

$$D(t) = \sqrt{(D(t_0))^2 + k_{future} \times (t - t_0)} \quad (5)$$

$$D(\tau_{tar}) = \sqrt{(D(t_0))^2 + k_{future} \times (\tau_{tar} - t_0)} \quad (6)$$

$$t = \frac{(D(t))^2 - (D(t_0))^2}{k_{future}} + t_0 \quad (7)$$

$$\tau = \frac{(D_{tar})^2 - (D(t_0))^2}{k_{future}} + t_0 \quad (8)$$

However, in Formula (8), it is difficult to know the use tendency U of the user at the beginning of use of the storage battery 101, and thus, it is difficult to know a value of the average value $k_{future}$ of the future degradation progression rate from the current timing $t_0$ to the certain future timing t. Thus, an actual value $k_{past}$ of the past degradation progression rates reflecting the use tendency of the user from a certain timing $t_1$ in the past to the current timing $t_0$ is obtained as shown in Formula (9), and the life prediction value $\tau$ is obtained by substituting the actual value $k_{past}$ of the degradation progression rates for the average value $k_{future}$ of the future degradation progression rate on the assumption that the actual value $k_{past}$ of the degradation progression rates continues from now on.

[Formula 3]

$$k_{past} = \frac{\Delta X}{\Delta t} = \frac{X(t_0) - X(t_1)}{t_0 - t_1} = \frac{(D(t_0))^2 - (D(t_1))^2}{(t_0 - t_1)} \quad (9)$$

Next, an example of a method of calculating the divergence amount Z in the divergence amount calculation unit 106 will be described. A ratio or a difference relating to the life prediction value and the life target value is used as the divergence amount Z. Formula (10) is used as an example of the divergence amount Z in the case of using the ratio between a remaining life prediction value from the current timing $t_0$ and a remaining life target value. In Formula (10), $\tau_{tar}$ is the life target value and $\tau$ is the life prediction value.

[Formula 4]

$$Z = \frac{\tau - t_0}{\tau_{tar} - t_0} \qquad (10)$$

Next, an example of a method of changing the limit value in the limit value change unit 108 will be described. The limit value change unit 108 changes a limit value L based on the divergence amount Z calculated by the divergence amount calculation unit 106 and a limit value $L_{past}$ from a certain past timing to the current timing. An example of the method of changing the limit value in the case of using the ratio between the remaining life prediction value and the remaining life target value as the divergence amount Z as described above will be described. In this case, when the divergence amount Z is smaller than one, the limit value L is changed to make limitation tighter such that the degradation progression rate k becomes smaller than the limit value $L_{past}$ from the certain past timing to the current timing. On the contrary, when the divergence amount Z is larger than one, the limit value L is changed to relax the limitation such that the degradation progression rate k becomes larger than the limit value $L_{past}$ from the certain past timing to the current timing. There are a plurality of methods for obtaining an optimum value of this limit value L.

As a first example of obtaining the optimum value of the limit value L, there is a method of directly obtaining the optimum value of the limit value L based on an actual value $U_{past}$ of the use tendency U of the user using map data or a function based on preliminarily-tested battery life evaluation data. Here, actual value $U_{past}$ of the use tendency U of the user is a representative value of history information stored in the history storage unit 104, such as an instantaneous value, an average value, a maximum value, a minimum value, and a histogram value of a past battery state parameter. In the case of a vehicle system such as a hybrid electric vehicle, a driving tendency such as accelerator opening and a braking frequency, and a use tendency of an electrical component such as a use frequency of an air conditioner may be included as the use tendency of the user.

In addition, when it is difficult to directly obtain the optimum value of the limit value L, there is the following method as a second example of obtaining the optimum value of the limit value L. First, the limit value is changed based on the divergence amount Z to such an extent not to cause vibration or divergence. After a predetermined time has elapsed, re-calculation of the divergence amount Z after the change of the limit value and re-change of the limit value L are repeated to search for the optimum value of the limit value L.

In the present embodiment, it is assumed that the same driving tendency as the history with the limit value $L_{past}$ until the current timing and the use tendency up to the present is continued when calculating the life prediction value $\tau$ until reaching the predetermined degradation amount target value $D_{tar}$. That is, in the process of Step S103 described above, the life prediction value $\tau$ until reaching the predetermined degradation amount target value $D_{tar}$ is predicted by replacing the average value $k_{future}$ of the future degradation progression rate of Formula (6) with the actual value of the past degradation progression rate or by respectively replacing U and L in Formula (4) with $U_{past}$ and $L_{past}$ based on the past history.

Figure 4:
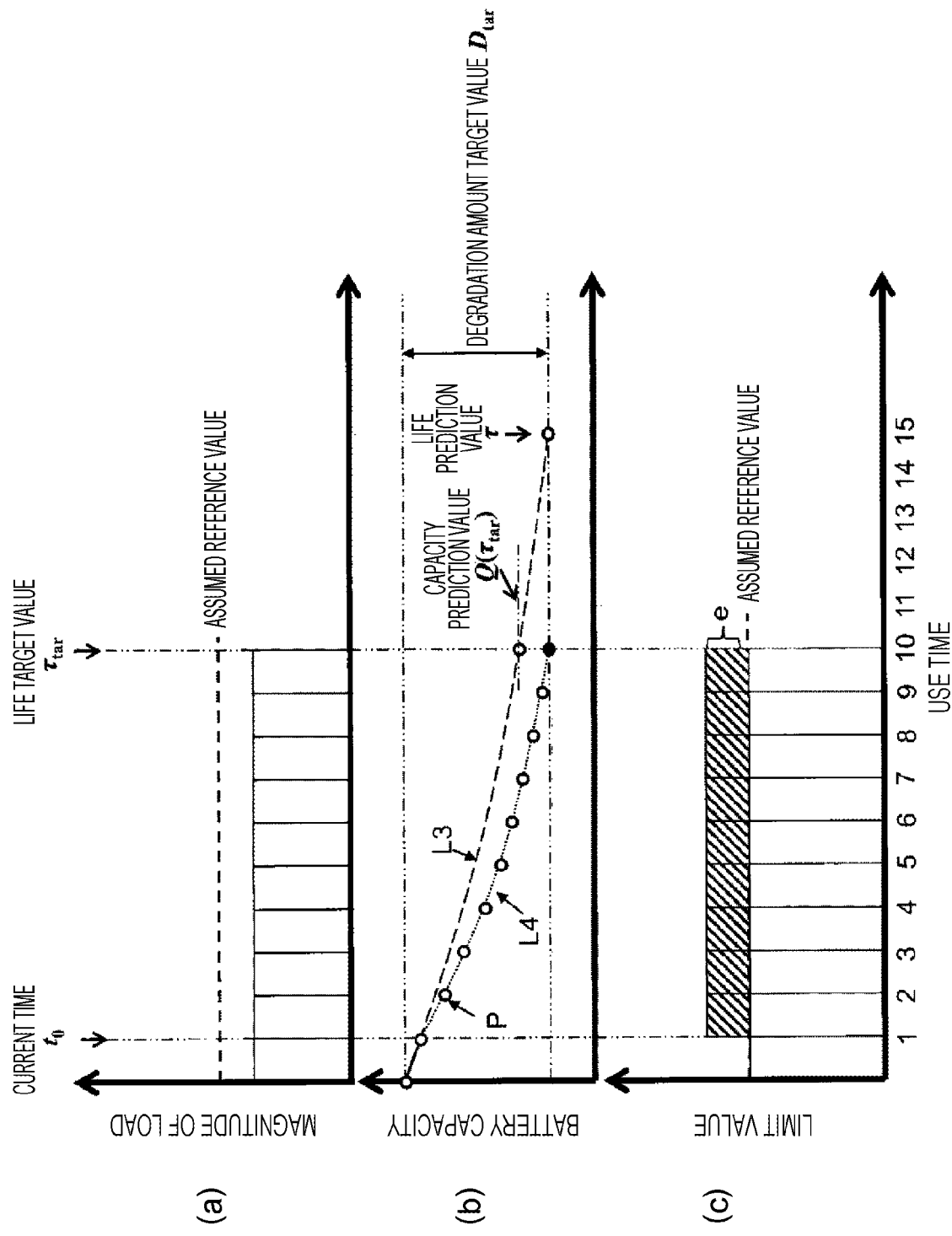
FIG. 4 is a view for describing an example of a method of setting a limit value according to the present embodiment.
Figure 5:
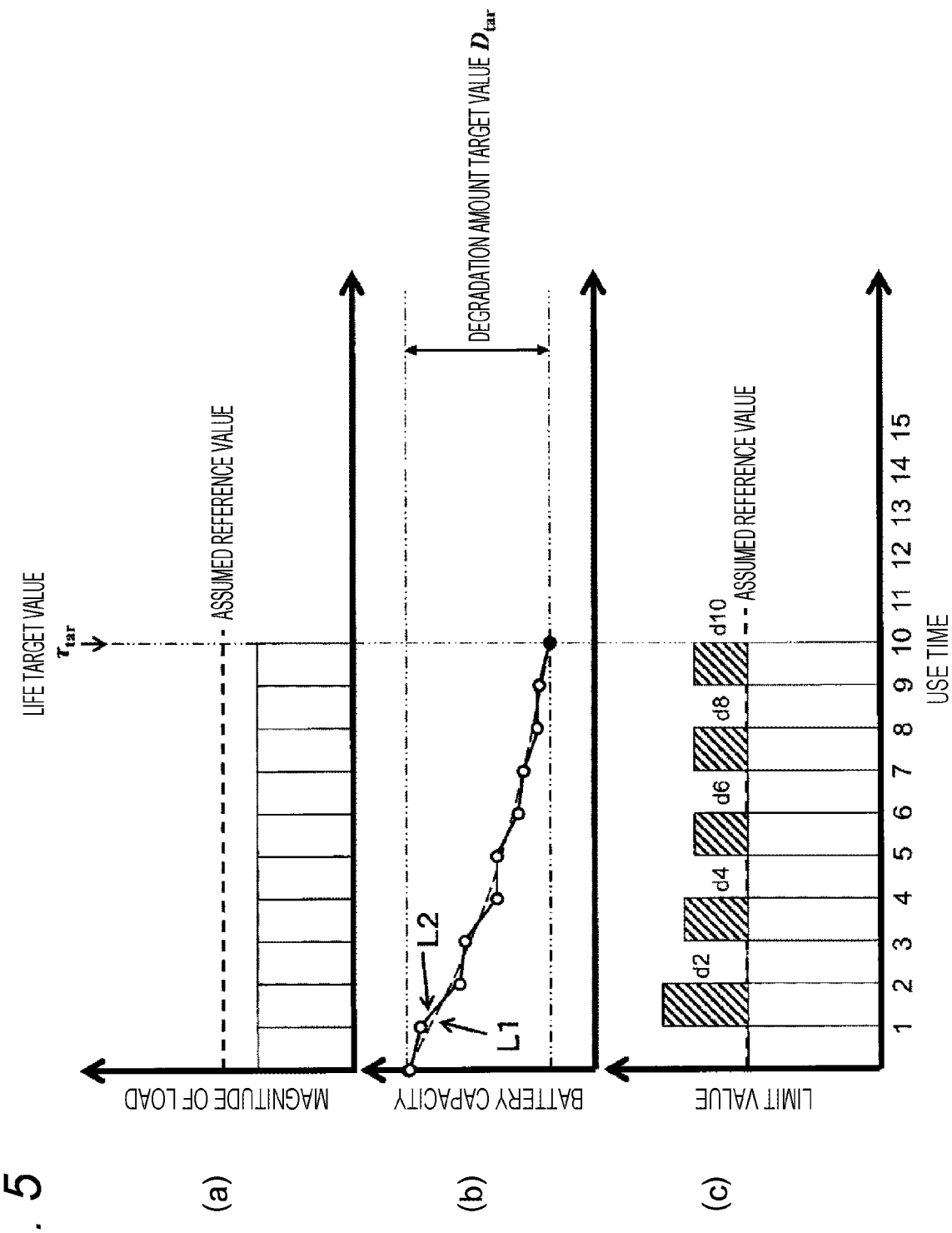
FIG. 5 illustrates an example of a method of setting a limit value in a conventional control as a comparative example.

FIG. 4 is a view for describing a method of setting the limit value according to the present embodiment. On the other hand, FIG. 5 illustrates an example of a method of setting a limit value in a conventional control as a comparative example. Either case illustrates transition of (a) a magnitude of a load, (b) a battery capacity, and (c) a limit value up to the timing of reaching the life target value. Since the battery capacity decreases as the storage battery 101 is degraded, the transition of the battery capacity illustrated in (b) represents the transition of battery degradation. Here, the description is given assuming that the life target value $\tau_{tar}$ is ten years.

First, FIG. 5 which is the comparative example will be described. When using the load of the assumed reference value illustrated in FIG. 5(a) and the limit value of the assumed reference value illustrated in FIG. 5(c), the battery capacity transitions as indicated by the assumed degradation curve L1 illustrated in FIG. 5(b). Further, the target value $D_{tar}$ is reached and the battery life expires at the timing of reaching the life target value $\tau_{tar}$.

In the use pattern illustrated in FIG. 5(a), it is assumed that a load is constant and a magnitude thereof is smaller than an assumed reference value. As illustrated in FIG. 5(c), a limit value at the time of starting to use the battery is set to the same magnitude as the assumed reference value. In addition, a line L2 in FIG. 5(b) indicates the actual transition of the battery capacity in the case of the use pattern as illustrated in FIG. 5(a). Incidentally, the limit value is assumed to be reviewed every year.

In the first year of use, the load is lower than the assumed reference value, a decrease in the battery capacity is smaller than that in the case of an assumed degradation curve L1. In the comparative example, the limit value is changed based on a degradation amount difference=(assumed degradation amount)−(actual degradation amount), and a magnitude of the change amount is set according to a magnitude of the degradation amount difference. At the end of one year, the limit value is changed to a limit value=(assumed reference value)+d2 such that the battery capacity after one year becomes a value on the assumed degradation curve L1. When the limit value increases in this manner, the allowable charge/discharge power output from the battery management device 100 increases. Accordingly, the driving force distribution of the motor/Generator 205 is increased, and the driving force distribution of the engine 206 is reduced. As a result, the progression of degradation (decrease in battery capacity) of the storage battery 101 becomes faster, and the battery capacity after the lapse of two years becomes a value on the assumed degradation curve L1.

Since the degradation amount difference after the lapse of two years is extremely small, and a degradation state as assumed is formed, and thus, the limit value is changed to the magnitude of the original assumed reference value. As a result, the decrease in battery capacity is smaller than an assumed decrease in the third year. Thus, the degradation amount difference becomes large after the lapse of three years, and the limit value is changed to (assumed reference value)+d4. Although the description regarding the transition from the fourth and subsequent years is omitted, the battery capacity reaches the degradation amount target value after the lapse of ten years, and the battery life expires.

In this manner, the degradation amount at a timing is compared with the assumed degradation curve L1 in an ideal control model, preliminarily set, every year in the comparative example illustrated in FIG. 5. Further, a limit value to be used in the next year is set such that the battery capacity one year later becomes a value assumed by the assumed degradation curve L1 based on a difference therebetween. Thus, the limit value largely fluctuates every year as illustrated in FIG. 5(c).

On the other hand, in the case of FIG. 4, the load illustrated in (a) is the same as that of the case of FIG. 5(a), and a load of each year until the vehicle life end timing (ten years) is constant, and a value thereof is set to be smaller than the assumed reference value. In the first year, a magnitude of a load and a magnitude of a limit value are the same as those in the case of FIG. 5, and a decrease in battery capacity during the first year is the same as that of the case illustrated in FIG. 5.

In the examples illustrated in FIGS. 4 and 5, the predetermined time in Step S101 in FIG. 3 is set to one year, and the processes of Step S102 and the subsequent steps in FIG. 3 are executed every year. As described above, since both the magnitude of the load and the limit value are set to the same conditions as those of the case illustrated in FIG. 5 in the first year, the decrease in battery capacity (progression of degradation) is the same as that of the case of the first year in FIG. 5(b).

The degradation prediction curve L3 in FIG. 4 is obtained by plotting a battery capacity change based on the degradation amount prediction value D(t) indicated by the following Formula (11). In Formula (11), $t_0$ is an elapsed time to the current timing (=one year), X ($t_0$) a degradation progression degree X at a timing $t=t_0$, and $k_{past}$ is the actual value of the degradation progression rate k. A change curve of the battery capacity in the first year constitutes a part of this degradation prediction curve (the first year).

[Formula 5]

$$Q(t)=Q_{ini}-D(t)=Q_{ini}-\sqrt{X(t_0)+k_{past}\times(t-t_0)} \quad (11)$$

In Step S103 of FIG. 3, the life prediction value τ until reaching the degradation amount target value $D_{tar}$ of the degradation prediction curve L3 is calculated. A lower limit of the battery capacity in FIG. 4(b) corresponds to the life target value $\tau_{tar}$ in Step S104, and a difference between $\tau_{tar}$ and τ corresponds to the divergence amount Z. Then, in Step S105, the divergence amount Z and the limit value based on the use tendency U of the user during the past one year (one year from the previous process to the current process) are determined as "(assumed reference value)+e". As described above, the use tendency U of the user is stored in the history storage unit 104 in the form of the representative value of the above-described history information. The limit value is stored in a storage medium (not illustrated), preliminarily provided in the limit value change unit 108, as a map having the divergence amount Z and the use tendency U of the user as parameters.

In this manner, when the limit value is changed to "(assumed reference value)+e" at the end of one year, the driving force distribution of the motor/generator 205 increases, and the decrease in the battery capacity becomes larger than that of the first year. A line L4 illustrated in FIG. 4 indicates an assumed degradation curve when the load state in FIG. 4(a) and the limit value=the assumed value+e in FIG. 4(c) are continued. The "assumed reference value e" of the limit value is set such that the life prediction value τ until reaching the degradation amount target value $D_{tar}$ and the life target value $\tau_{tar}$ coincide with each other. That is, the above-described map of the limit value gives a limit value that allows the life prediction value τ until reaching the degradation amount target value $D_{tar}$ to be the life target value $\tau_{tar}$. For example, it is a limit value that gives an assumed degradation curve L4 in FIG. 4.

A limit value and a magnitude of a load of the second year are the same as a limit value and a magnitude of a load at the time of deriving the assumed degradation curve L4. Thus, the battery capacity (a value at a position indicated by a reference sign P) after the lapse of two years is substantially the same value as the value given by the assumed degradation curve L4. Further, the life prediction value τ calculated in Step S103 is the life prediction value τ until reaching the degradation amount target $D_{tar}$ when the load of the second year and the limit value of the second year (=assumed reference value+e) are continued even in the third and subsequent years. Thus, the life prediction value τ has the same value as the life target value $\tau_{tar}$. As a result, the limit value to be determined in Step S105 after the lapse of two years is "assumed reference value+e". The limit value is obtained with completely the same procedure in the third and subsequent years, and the battery capacity indicated by a circle is substantially the same as the value given by the assumed degradation curve L4. As a result, all the limit values from the second year to the tenth year are set to "assumed reference value+e".

Figure 6:
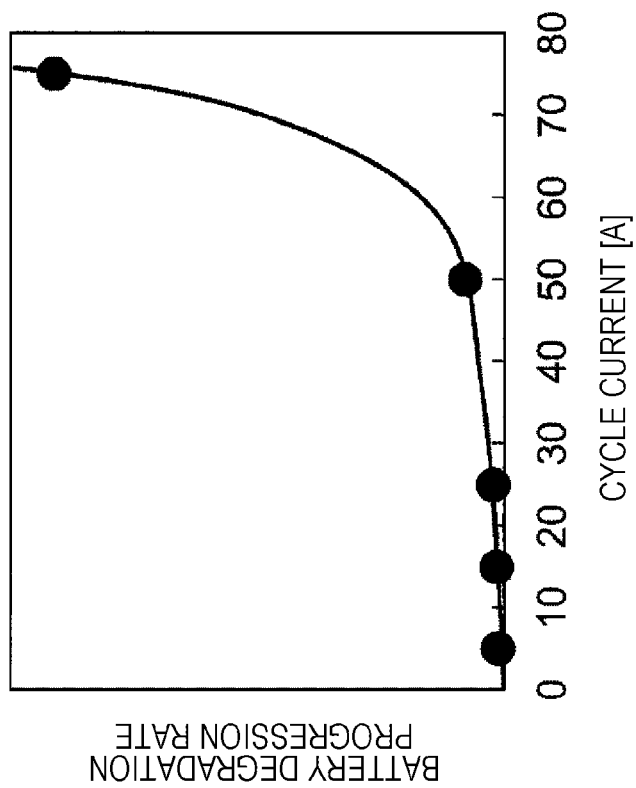
FIG. 6 is a view illustrating a cycle current dependency of a battery degradation progression rate when a constant current charge/discharge cycle is performed in a predetermined SOC range.

FIG. 6 is a view illustrating a cycle current dependency of the battery degradation progression rate k when a constant current charge/discharge cycle is performed in a predetermined SOC range. As understood from FIG. 6, the degradation progression rate k of the battery increases in an acceleration manner as the cycle current increases.

In the control illustrated in FIGS. 4 and 5, the battery capacity of the storage battery 101 reaches a lower limit value at the vehicle life end timing in any case. That is, the life of the storage battery 101 also expires at the vehicle life end timing. However, since the degradation progression rate k of the battery has characteristics as illustrated in FIG. 6, a difference arises from the viewpoint of effectively utilizing battery performance. The effective utilization of battery performance will be described with reference to FIG. 7.

Figure 7:
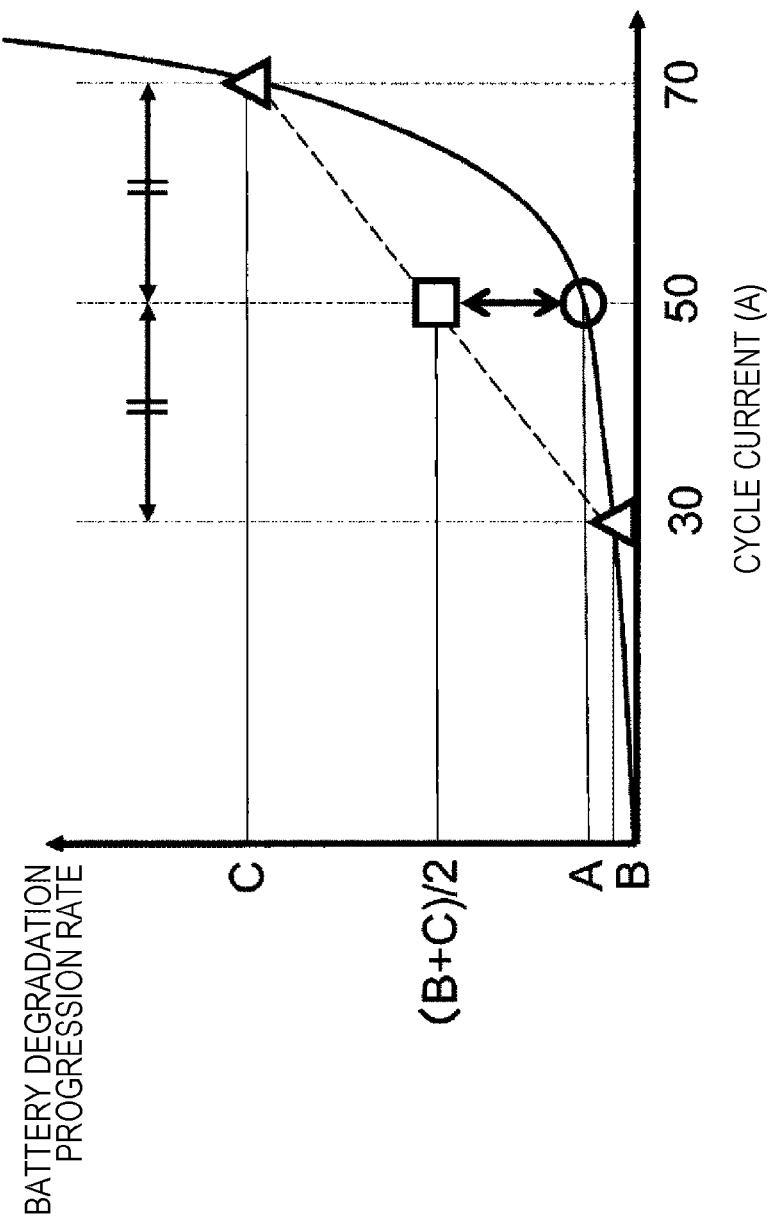
FIG. 7 is a view for describing influence of presence/absence of a current fluctuation on the battery degradation progression rate when an average value of a cycle current is fixed.

FIG. 7 is a view for describing how presence or absence of a current fluctuation when an average value of the cycle current is fixed affects the degradation progression rate k of the battery. First, when there is no current fluctuation, the degradation progression rate k of the battery in a case where the cycle current is fixed to 50 (A) becomes A, for example. On the other hand, when there is the current fluctuation, it is possible to consider a case where a cycle current in a half the time in the above-described case is 30 (A) and a cycle current in the remaining half is 70 (A), for example. The degradation progression rate k of the battery at the cycle current of 30 (A) is B, and the degradation progression rate k of the battery at the cycle current of 70 (A) is C.

Thus, when the current cycle time of 30 (A) and 70 (A) each is set to the half, the degradation progression rate k of the battery becomes (B+C)/2. Since the degradation progression rate k of the battery increases in an acceleration manner with respect to a change of the cycle current, generally, {(B+C)/2}<A. Accordingly, it is understood that the degradation progression rate k of the battery increases as the current fluctuation increases.

For example, when comparing the case of being used at 30 A for 100 hours and at 70 A for 100 hours and the case of being used at 50 A for 200 hours, a total capacity use amount (Ah) is 10000 (Ah) in either case, but in the battery degradation is little in the latter case. In other words, when the battery degradation caused by the battery use is the same, it is possible to utilize more capacity (Ah) in the latter case.

In the graph illustrated in FIG. 7, the cycle current at which the degradation progression rate k of the battery becomes equal to (B+C)/2 is about 65 (A), and thus, the capacity use amount (Ah) becomes 13000 (Ah) when used at 65 (A) for 200 hours.

The limit value is constant until the battery life expires in the case of the present embodiment illustrated in FIG. 4, but the limit value greatly varies from year to year in the comparative example illustrated in FIG. 5. Thus, the capacity (Ah) that can be caused to flow until the battery capacity of the storage battery 101 reaches the lower limit value is larger in the case of FIG. 4.

Second Embodiment

Figure 8:
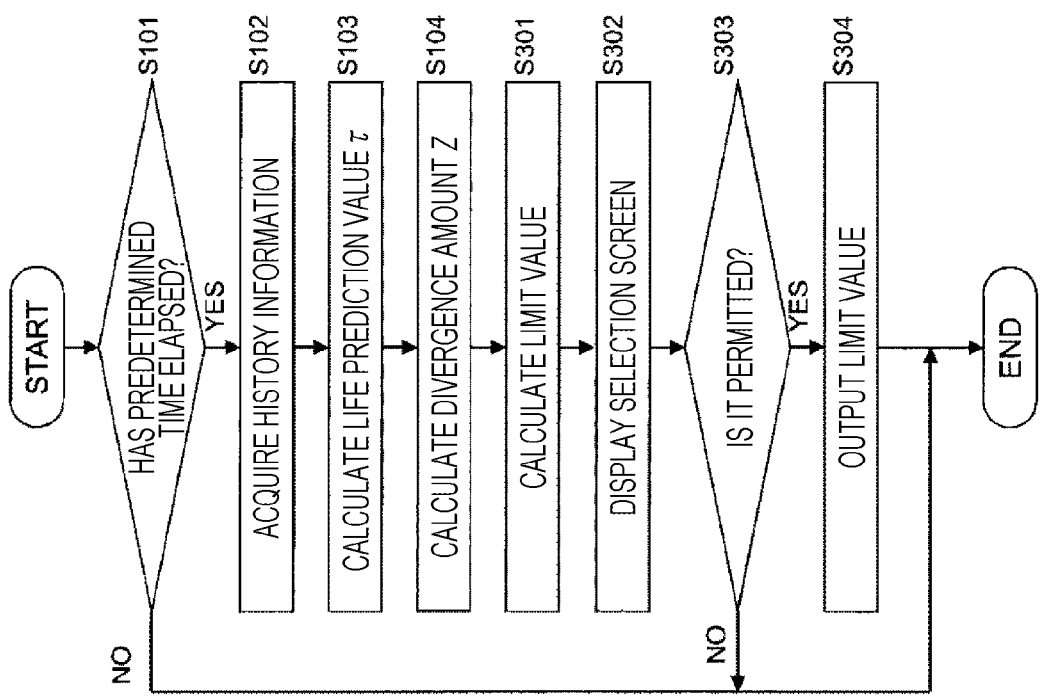
FIG. 8 is a control flowchart according to a second embodiment.

FIG. 8 is a control flowchart according to a second embodiment. Incidentally, processes from Step S101 to Step S104 in the flowchart illustrated in FIG. 8 are the same as the processes from Step S101 to Step S104 in FIG. 3. That is, if it is determined in Step S101 that the predetermined time has elapsed from the previous calculation processing, the process proceeds to Step S102 to acquire the history information from the history storage unit 104. Further, the life prediction value τ until reaching the degradation amount target value is calculated in Step S103, and then, the divergence amount Z between the life prediction value τ and the life target value $\tau_{tar}$ is calculated in Step S104.

In Step S301, the limit value on the battery performance is calculated based on the calculated divergence amount Z. In Step S302, the calculated limit value is displayed, and a selection screen for obtaining an instruction on whether or not to permit the limit value is displayed on the display device 201 in FIG. 2. By operating the input device 202 in FIG. 2, the user 209 inputs the instruction for permission or non-permission. It is determined whether or not a permission signal has been input in Step S303, the process proceeds to Step S304 in the case of permission, and the process is stopped in the case of non-permission. In Step S304, a value of the limit value calculated in Step S301 is changed as the limit value, and the changed limit value is output to the charge/discharge control unit 102.

In this manner, the user can select whether or not to actually adopt the limit value calculated by the limit value change unit 108 in the present embodiment. For example, when the change of the limit value has not been performed based on the user's determination at the timing at which one year has elapsed in FIG. 4, the degradation transition in the second year is the same as the degradation Prediction curve L3. However, when the change of the limit value has been permitted after the lapse of two years, the limit value is determined such that the life prediction value at the timing of reaching the degradation amount target value $D_{tar}$ coincides with the life target value, and thus, it is possible to perform the control such that the battery life expires at the vehicle life end timing, and further, it is possible to more effectively utilize the performance of the storage battery 101.

Third Embodiment

Figure 9:
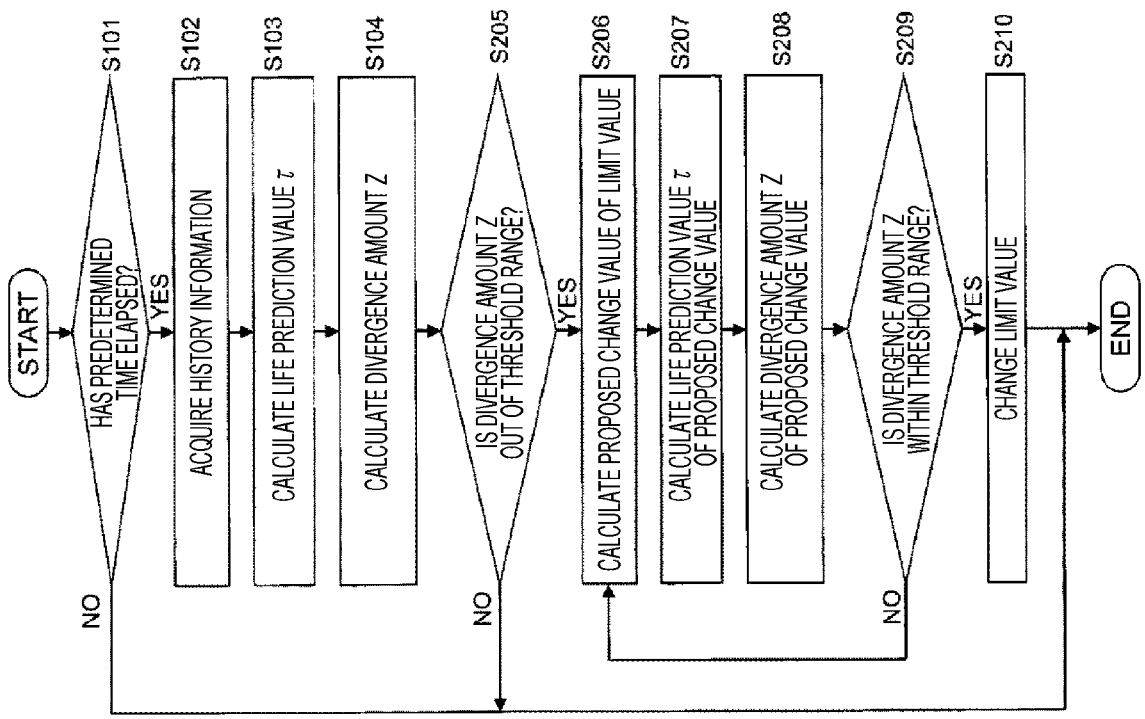
FIG. 9 is a control flowchart according to a third embodiment.

FIG. 9 is a control flowchart according to a third embodiment. In the first and second embodiments described above, the limit value that allows the life prediction value τ until reaching the degradation amount target value $D_{tar}$ to be the life target value $\tau_{tar}$ is determined based on the calculated divergence amount Z and the history of battery information. However, when there is no means for directly calculating the optimum limit value L (for example, when the limit value change unit changes the limit value by a predetermined amount according to positive/negative determination of the divergence amount Z or the like), there is a risk that the degradation amount of the battery at the timing of reaching the life target value does not become the degradation amount target value. In the third embodiment, a battery life is predicted using a proposed change value of the limit value, a process of calculating a divergence amount is repeated until the divergence amount falls within an allowable threshold range, and the proposed change value when the divergence amount falls within the threshold range is adopted as a limit value. Since a fact that the divergence amount after the change of the limit value falls within the threshold range is confirmed and calculated by the life prediction in this manner, it is possible to obtain a maximum likelihood value for preventing occurrence of a situation where the degradation amount at the timing of reaching the life target value does not become the degradation amount target value. Incidentally, processes from Step S101 to Step S104 in the flowchart illustrated in FIG. 9 are the same as the processes from Step S101 to Step S104 in FIG. 3, and the description thereof will be omitted.

When the divergence amount Z between the life prediction value τ and the life target value $\tau_{tar}$ is calculated in Step S104, it is determined in Step S205 whether or not the divergence amount Z is equal to or greater than a preliminarily set threshold. The process is stopped when it is determined in Step S205 that the divergence amount Z falls within the threshold range, and proceeds to Step S206 when it is determined that the divergence amount Z is equal to or greater than the threshold. The processes from Step S206 to Step S209 are processes configured to obtain an optimum limit value, and it is possible to acquire the limit value that enables obtaining of the divergence amount Z within the threshold range by repeating a series of the processes.

In Step S206, a proposed change value of the battery performance limit value is calculated in order to make the divergence amount Z approximate to zero. The proposed change of the limit value thus calculated is output to the life prediction unit 105 as indicated by the broken-line arrow in FIG. 1. As a method of setting the proposed change value of the limit value, for example, the proposed change value may be set based on the divergence amount Z calculated in Step S104 or may be set based on a representative value of history information stored in the history storage unit 104 (such as an average value of the voltage, current, stored electricity amount, or the like, which are the battery state parameters). Here, the case of setting the proposed change value of the limit value based on the divergence amount Z will be described as an example.

In Step S207, the life prediction unit 105 in FIG. 1 calculates the life prediction value τ until reaching the degradation amount target value when the limit value is changed to the proposed change value. In Step S208, the divergence amount Z between the life prediction value τ calculated in Step S207 and the life target value $\tau_{tar}$ stored in the life target value storage unit 107 is calculated by the divergence amount calculation unit 106. In Step S209, it is determined whether or not the divergence amount Z calculated in Step S208 falls within the threshold range, and the process proceeds to Step S206 when the divergence amount Z is out of the threshold range and proceeds to Step S210 when the divergence amount Z falls within the threshold range. In Step S210, the limit value is changed by setting the proposed change value calculated in Step S206 as the limit value.

On the other hand, when the processing has proceeded from Step S209 to Step S206, a proposed change value of the limit value is set again. For example, when Z in Step S208 is defined as $Z=(\tau-t_0)/(\tau_{tar}-t_0)$, a proposed change is set to $L+\Delta L$ in a direction to reinforce the proposed change L of the previous limit value if Z<0.9. Conversely, if Z>1.1, the proposed change is reset to $L-\Delta L$ in a direction to relax the proposed change L of the previous limit value. Further, the process is performed in the order of Step S207, Step S208, and Step S209, and the process proceeds to Step S210 when it is determined that a lower limit threshold<Z<an upper limit threshold in Step S209. In this manner, the processes from Step S206 to Step S209 are repeated until the divergence amount Z falls within the threshold range.

When the limit value is set as described above, it is possible to achieve the same operational effects as those of the above-described first embodiment in the present embodiment as well. Moreover, it is possible to further improve the accuracy of the limit value. Incidentally, it is possible to apply the above-described processing according to the second embodiment to the present embodiment as well.

As described above, a battery use condition calculated based on the representative values such as the voltage, current, and stored electricity amount of the storage battery 101 in an arbitrary period from the past to the present is stored in the history storage unit 104, and the life target value $\tau_{tar}$ when the storage battery 101 is used until reaching the degradation amount target value $D_{tar}$ is stored in the life target value storage unit 107. The life prediction unit 105 calculates the life prediction value $\tau$ when the storage battery 101 is used until reaching the degradation amount target value $D_{tar}$ with a preliminarily set first charge/discharge limit value (control parameter) and the battery use condition. For example, after the lapse of one year in the example illustrated in FIG. 4, the life prediction value r when the storage battery 101 is used with the preliminarily set limit value of the first year in FIG. 4(c) and the load of the first year in FIG. 4(a) until reaching the degradation amount target value $D_{tar}$ is calculated. Further, the divergence amount calculation unit 106 calculates the divergence amount Z between the life target value $\tau_{tar}$ of the life target value storage unit 107 and the calculated life prediction value $\tau$. Then, the limit value change unit 108 calculates a second charge/discharge limit value (control parameter) based on the calculated divergence amount Z and the battery use condition stored in the history storage unit 104, and resets the second charge/discharge limit value as the first charge/discharge limit value. As described above, since the limit value is determined based on the life prediction value $\tau$ until reaching the degradation amount target value $D_{tar}$ and the divergence amount Z of the life target value $\tau_{tar}$, it is possible to suppress a change of the battery charge/discharge condition to be low as illustrated in FIG. 4(c). As a result, it is possible to perform the control such that the life target value $\tau_{tar}$ and the battery life coincide with each other, and further, it is possible to more effectively utilize the performance of the storage battery 101.

Incidentally, the life prediction value $\tau$ when the storage battery 101 is used until reaching the degradation amount target value $D_{tar}$ with the preliminarily set first charge/discharge limit value and the battery use condition is predicted by the life prediction unit 105, and the divergence amount Z between the life target value $\tau_{tar}$ and the life prediction value $\tau$ is calculated by the divergence amount calculation unit 106 in the above-described embodiment. However, it may be configured such that a degradation amount prediction value of the storage battery 101 at the life target value timing is predicted by a life prediction unit 105, and a divergence amount between a degradation amount target value and the degradation amount prediction value is calculated in the divergence amount calculation unit 106.

Preferably, the second charge/discharge limit value is calculated such that the life prediction value $\tau$ becomes the life target value $\tau_{tar}$ when the storage battery 101 is used until reaching the degradation amount target value $D_{tar}$ based on the calculated divergence amount Z and the battery use condition stored in the history storage unit 104. Incidentally, when calculating the divergence amount between the degradation amount target value and the degradation amount prediction value in the divergence amount calculation unit 106 as described above, the second charge/discharge limit value is calculated such that the degradation amount prediction value is equal to the degradation amount target value.

In addition, when the limit value change unit 108 determines that the divergence amount Z calculated by the divergence amount calculation unit 106 is equal to or greater than the threshold (S205) as illustrated in FIG. 9, the control unit 109 repeatedly performing a series of processes of setting a proposed change value as the first charge/discharge limit value, predicting the life prediction value $\tau$ when the storage battery 101 is used until reaching the degradation amount target value $D_{tar}$ with the proposed change value and the battery use condition stored in the history storage unit 104, and calculating the divergence amount Z between the life prediction value prediction value $\tau$ and the stored life target value $\tau_{tar}$ until the divergence amount Z calculated by the divergence amount calculation unit falls within the threshold range. Then, the proposed change value when the calculated divergence amount Z falls within the threshold range may be reset as the first charge/discharge limit value.

As described above, when calculating the divergence amount between the degradation amount target value and the degradation amount prediction value in the divergence amount calculation unit 106, a series of processes of calculating the divergence amount between the degradation amount target value and the degradation amount prediction value may be repeatedly performed until the divergence amount calculated by the divergence amount calculation unit falls within the threshold range.

Fourth Embodiment

The description has been given in the first to third embodiments described above regarding the example in which the limit value L for the control parameters such as the allowable charge/discharge current, the allowable charge/discharge power, the SOC operation range, and the temperature operation range is changed by the limit value change unit 108 based on the divergence amount Z calculated by the divergence amount calculation unit 106, and the charge/discharge current flowing through the storage battery 101 is controlled based on the changed limit value L. In regard to this, hereinafter, a description will be given in the present embodiment regarding an example in which a limit value set obtained by combining limit values for each of a plurality of types of control parameters is calculated by the limit value change unit 108 based on the divergence amount Z calculated by the divergence amount calculation unit 106, and a charge/discharge current flowing through the storage battery 101 is controlled based on this limit value set.

Incidentally, configurations other than the processing content of the limit value change unit 108 in FIG. 1 are the same as those described in each of the first to third embodiments in the present embodiment. That is, the configuration of the battery management device 100 according to the present embodiment and the configuration of the hybrid vehicle control system including the battery management device 100 are the same as those illustrated in each of FIGS. 1 and 2. Thus, in the following description, a description will be omitted regarding parts other than the processing content of the limit value change unit 108 in the present embodiment unless particularly necessary.

Figure 10:
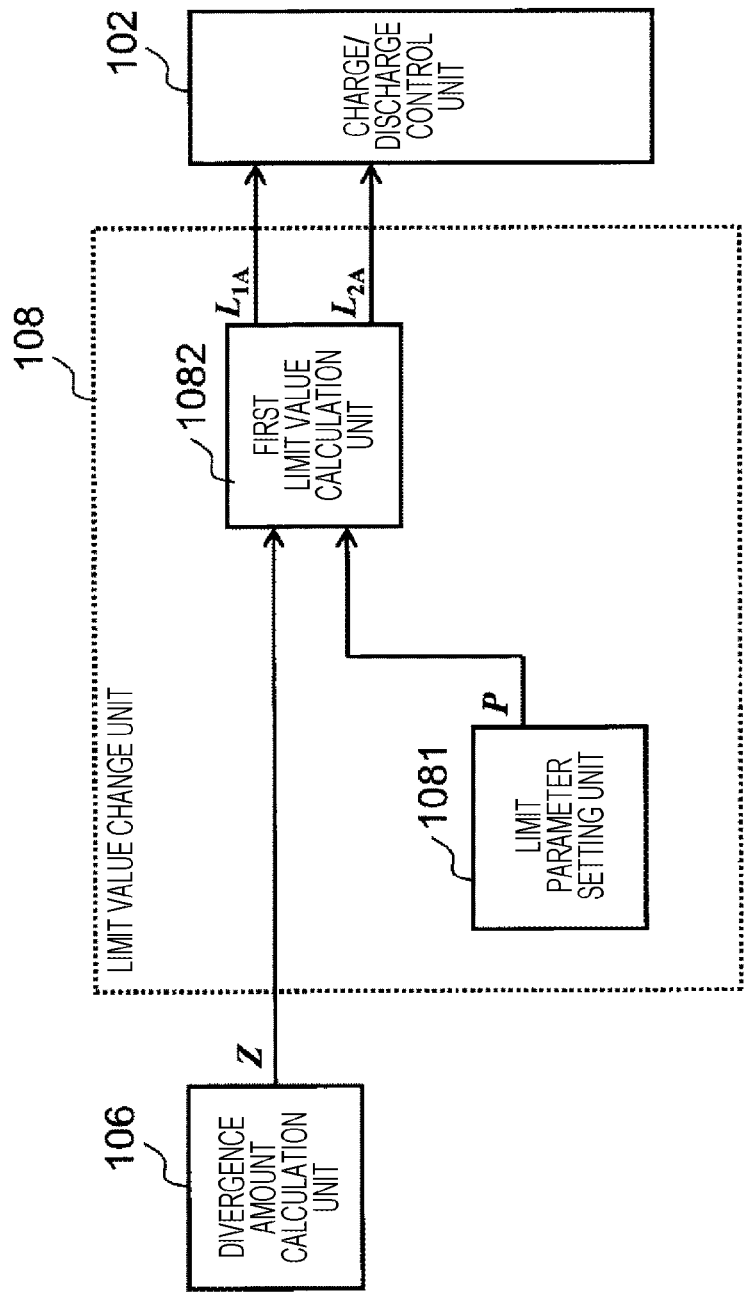
FIG. 10 is a control block diagram of a limit value change unit according to a fourth embodiment of the present invention.

FIG. 10 is a control block diagram of the limit value change unit 108 according to a fourth embodiment of the present invention. As illustrated in FIG. 10, the limit value change unit 108 is configured of the respective control blocks of a limit parameter setting unit 1081 and a first limit value calculation unit 1082 in the present embodiment.

The limit parameter setting unit 1081 sets a limit parameter P to determine weighting for each of the plurality of types of control parameters to be subjected to calculation of the limit value set by the limit value change unit 108. The limit parameter setting unit 1081 sets values of a minimum voltage, a center SOC, and the like at the time of charge/discharge of the storage battery 101 as the limit parameter P based on the history information stored in the history storage unit 104, for example. Alternatively, the limit parameter P may be stored in the limit parameter setting unit 1081 in advance, and the limit parameter P may be set by using this parameter as well. Accordingly, values of $V_{min}$=2.5 V when the minimum voltage of the storage battery 101 is represented as $V_{min}$, and $SOC_{center}$=50% when the center SOC of the storage battery 101 is represented as $SOC_{center}$ are set as the limit parameter P.

The first limit value calculation unit 1082 calculates limit values $L_{1A}$ and $L_{2A}$ with respect to the control parameters for controlling the charge/discharge of the storage battery 101 based on the divergence amount Z calculated by the divergence amount calculation unit 106 and the limit parameter P set by the limit parameter setting unit 1081. Incidentally, a combination of the limit values $L_{1A}$ and $L_{2A}$ will be referred to as a first limit value set in the following description. For example, the first limit value calculation unit 1082 stores map data representing data of the limit value $L_{1A}$ and the limit value $L_{2A}$ corresponding to various combinations of the divergence amount Z and the limit parameter P, and can calculate the first limit value set based on the input divergence amount Z and limit parameter P using this map data. Then, the calculation result of the first limit value set is output to the charge/discharge control unit 102.

The charge/discharge control unit 102 controls the charge/discharge current of the storage battery 101 based on the first limit value set calculated by the first limit value calculation unit 1082 of the limit value change unit 108 and the battery information (battery state parameter) output from the battery management device 100.

Figure 11:
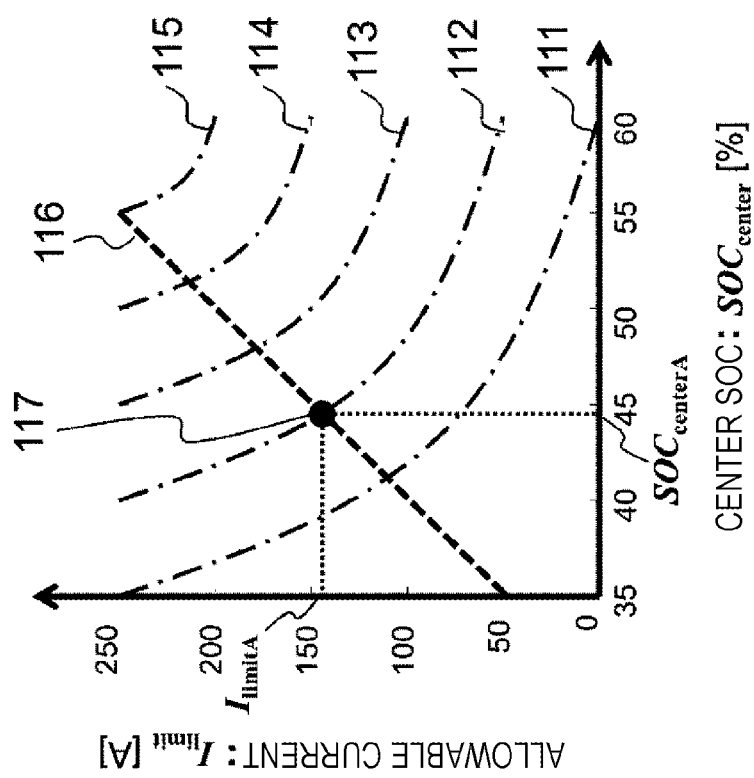
FIG. 11 is a view for describing an example of a method of calculating a first limit value set using a first limit value calculation unit.

FIG. 11 is a view for describing an example of a method of calculating the first limit value set using the first limit value calculation unit 1082. The first limit value calculation unit 1082 stores graph data as illustrated in FIG. 11, for example, as the map data. In this graph, various first limit value sets corresponding to values of the divergence amount Z are indicated by curved graphs 111 to 115. For each of the graphs 111 to 115, a value of $SOC_{center}$ illustrated on the horizontal axis represents the center SOC of the storage battery 101, which corresponds to the limit value $L_{1A}$ with respect to the SOC operation range which is one of the control parameters. On the other hand, a value of $I_{limit}$ illustrated on the vertical axis represents the allowable current of the storage battery 101, which corresponds to the limit value $L_{2A}$ with respect to the allowable charge/discharge current which is one of the other control parameters. The control parameters whose values are limited in accordance with these control values $L_{1A}$ and $L_{2A}$, respectively, change according to the graphs 111 to 115 with correlation with each other. Incidentally, a graph positioned in an upper right direction in the drawing indicates a high degree of energy utilization of the storage battery 101 in the graphs 111 to 115.

In addition, the straight-line graph 116 indicated by a broken line in the drawing represents the minimum voltage $V_{min}$ of the storage battery 101, which is one of the limit parameters P. Here, for example, $V_{min}$=2.5 V, and a ratio of $SOC_{center}$ and $I_{limit}$ corresponding to this minimum voltage $V_{min}$ is indicated by the graph 116. According to the graph 116, the weighting is determined between the SOC operation range, which is the control parameter limited by the control value $L_{1A}$, and the allowable charge/discharge current which is the control parameter limited by the limit value $L_{2A}$.

The first limit value calculation unit 1082 selects any of the graphs 111 to 115, for example, the graph 112, based on the value of the divergence amount Z. Then, an intersection 117 between the selected graph 112 and the graph 116 corresponding to the limit parameter P is detected, and $SOC_{centerA}$ and $I_{limitA}$ which are values of $SOC_{center}$ and $I_{limit}$ corresponding to this intersection 117 are obtained as the first limit value set. In this manner, for example, the first limit value calculation unit 1082 can calculate the first limit value set based on the divergence amount Z and the limit parameter P.

According to the fourth embodiment of the present invention described above, the following operational effects are achieved.

(1) The battery management device 100 includes: the divergence amount calculation unit 106 that calculates the divergence amount Z between the life target value or the degradation amount target value of the storage battery 101, which is the secondary battery, and the life prediction value or the degradation amount prediction value according to the use history of the storage battery 101 in an arbitrary period from the past to the present; and the limit value change unit 108 that changes the charge/discharge limit values $L_{1A}$ and $L_{2A}$ for controlling the degradation of the storage battery 101 based on the divergence amount Z calculated by the divergence amount calculation unit 106. The limit value change unit 108 includes the first limit value calculation unit 1082 that calculates the first limit value set that is the combination of the charge/discharge limit values $L_{1A}$ and $L_{2A}$ for each of the plurality of types of control parameters that change in correlation with each other based on the divergence amount Z. In this manner, the limit value on the battery performance is released as much as possible with the stable value while securing the battery life with respect to the users having different magnitudes of battery loads, and the battery performance can be effectively utilized.

(2) The limit value change unit 108 further includes the limit parameter setting unit 1081 that sets the limit parameter P to determine the weighting for each of the plurality of types of control parameters. The first limit value calculation unit 1082 calculates the first limit value set based on the divergence amount Z and the limit parameter P. In this manner, each limit value of the first limit value set based on the divergence amount Z can be obtained at the same time with appropriate weighting.

Fifth Embodiment

Figure 12:
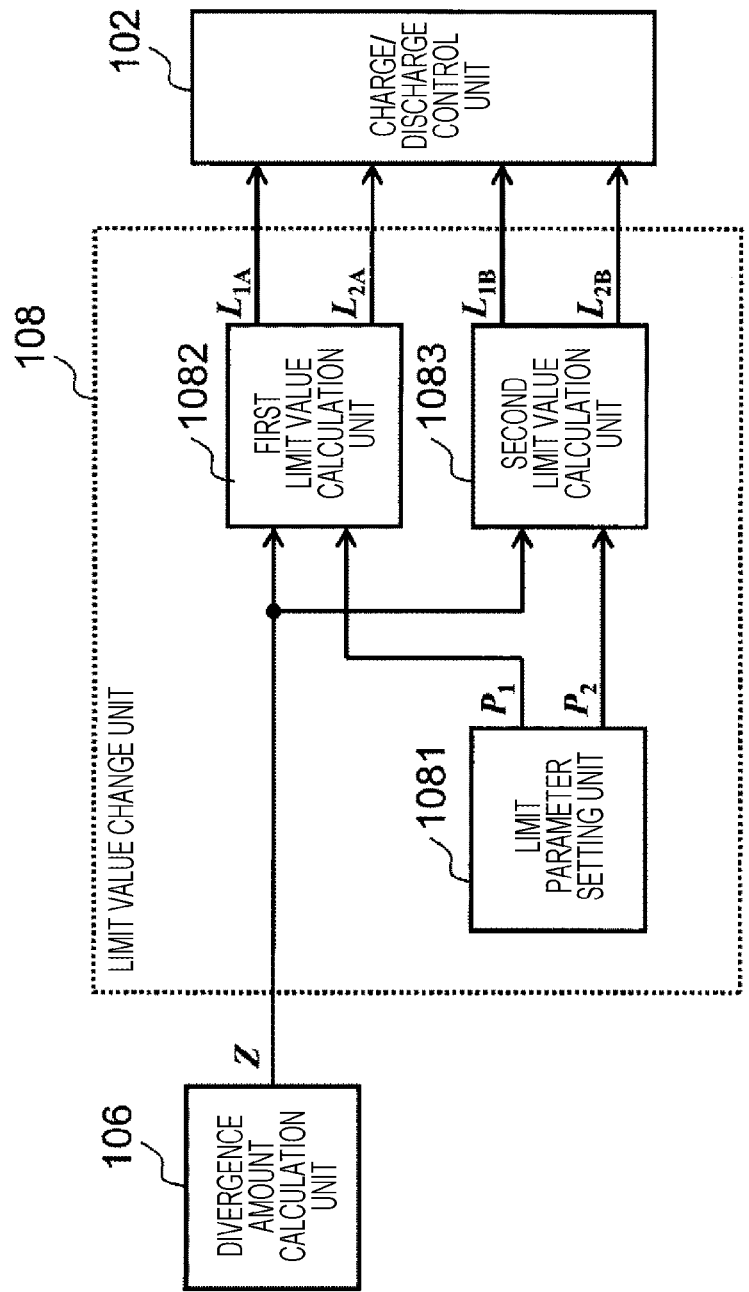
FIG. 12 is a control block diagram of a limit value chancre unit according to a fifth embodiment of the present invention.

FIG. 12 is a control block diagram of the limit value change unit 108 according to a fifth embodiment of the present invention. In the present embodiment, the limit value change unit 108 further includes a second limit value calculation unit 1083 in addition to the limit parameter setting unit 1081 and the first limit value calculation unit 1082 described in the fourth embodiment as illustrated in FIG. 12.

In the present embodiment, the limit parameter setting unit 1081 sets two types of limit parameters $P_1$ and $P_2$. For example, =2.5 V is set as the limit parameter $P_1$ and $SOC_{center}$=50% is set as the limit parameter $P_2$.

The first limit value calculation unit 1082 calculates the first limit value set, that is, the limit values $L_{1A}$ and $L_{2A}$ similarly to those described in the fourth embodiment based on the divergence amount Z calculated by the divergence amount calculation unit 106 and the limit parameter $P_1$ set by the limit parameter setting unit 1081.

On the other hand, the second limit value calculation unit 1083 calculates limit values $L_{1B}$ and $L_{2B}$ with respect to the control parameters for controlling the charge/discharge of the storage battery 101 based on the divergence amount Z calculated by the divergence amount calculation unit 106 and the limit parameter $P_2$ set by the limit parameter setting unit 1081. Hereinafter, a combination of the limit values $L_{1B}$ and $L_{2B}$ will be referred to as a second limit value set.

The respective limit values $L_{1B}$ and $L_{2B}$ of the second limit value set indicate different values of the same control parameters as the respective limit values $L_{1A}$ and $L_{2A}$ of the first limit value, set calculated by the first limit value calculation unit 1082, and are obtained by the same calculation method as the first limit value set. For example, the respective limit Values of $SOC_{centerB}$ and $I_{limitB}$ of the second limit value set are obtained in the map data illustrated in FIG. 11 by using $SOC_{center}$=50%, which is the limit parameter different from the above-described limit parameter $V_{min}$=2.5 V, as the limit parameter $P_2$. Incidentally, $SOC_{centerB}$=50% in this case, and it is understood from FIG. 11 that $SOC_{centerA}$<$SOC_{centerB}$. On the other hand, it is understood from a shape of the graph 112 that $I_{limitA}$>$I_{limitB}$.

The charge/discharge control unit 102 controls a charge/discharge current of the storage battery 101 using either the first limit value set calculated by the first limit value calculation unit 1082 of the limit value change unit 108 or the second limit value set calculated by the second limit value calculation unit 1083. Selection of any of the first limit value set and the second limit value set to be used in the charge/discharge control unit 102 can be performed by an arbitrary method. For example, charge/discharge control unit 102 selects the first limit value set or the second limit value set according to various conditions such as a state of a battery load, a request of a user, and an operation mode of the battery management device 100, and can use the selected set for controlling the charge/discharge current of the storage battery 101.

According to the fifth embodiment of the present invention described above, the following operational effect is further achieved in addition to the effects of (1) and (2) described in the fourth embodiment.

Figure 13:
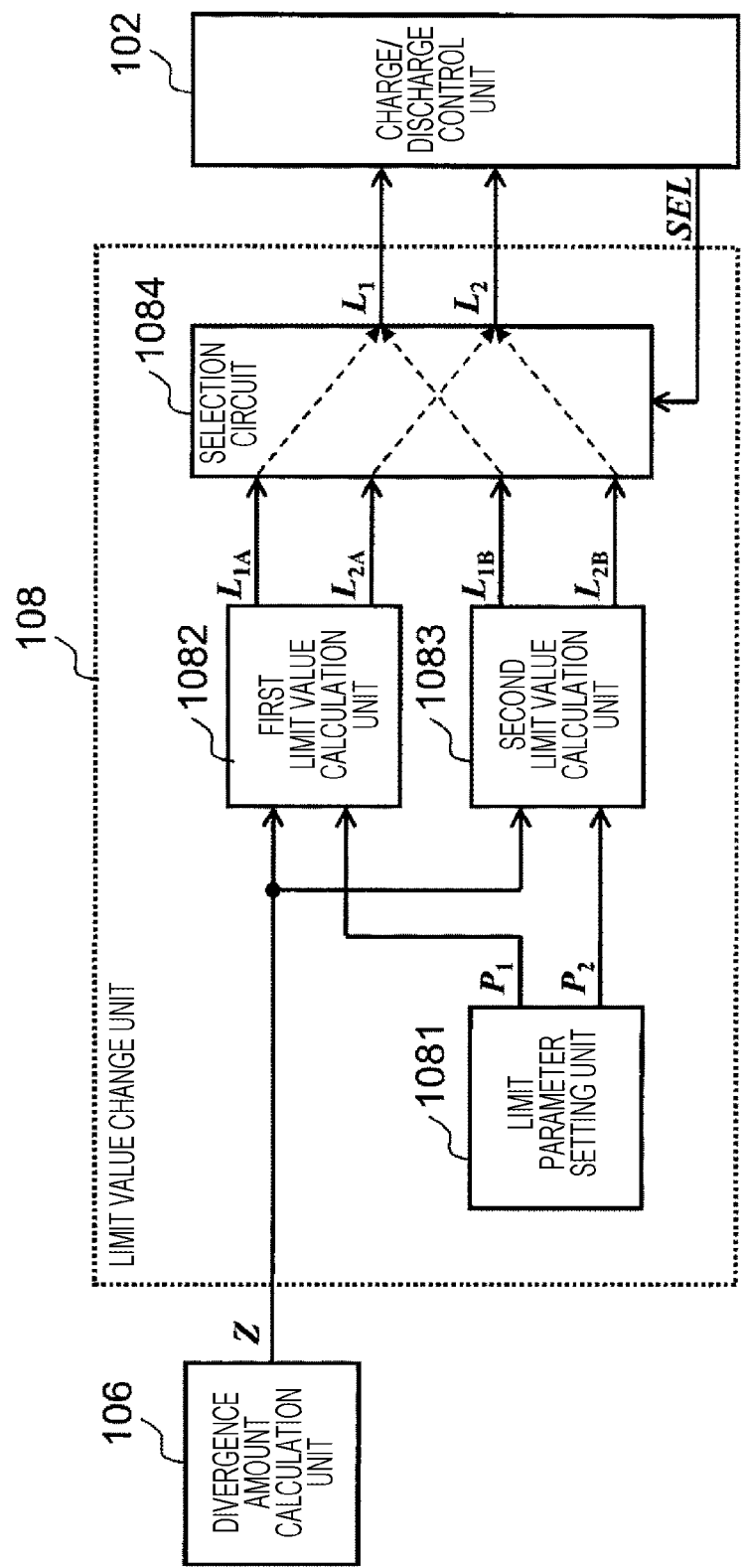
FIG. 13 is a control block diagram of a limit value change unit according to a sixth embodiment of the present invention.

(3) The limit value change unit 108 further includes the second limit value calculation unit 1083 that calculates the second limit value set, different from the first limit value set and obtained by combining charge/discharge limit values for each of the plurality of types of control parameters, based on the divergence amount Z. The limit parameter setting unit 1081 sets the first limit parameter $P_1$ and the second limit parameter $P_2$ as the limit parameters. The first limit value calculation unit 1082 calculates the first limit value set based on the divergence amount Z and the first limit parameter $P_1$. The second limit value calculation unit 1083 calculates the second limit value set based on the divergence amount Z and the second limit parameter $P_2$. In this manner, it is possible to utilize an appropriate limit value on battery performance according to a situation while securing the battery life with respect to the users having different magnitudes of battery loads Sixth Embodiment FIG. 13 is a control block diagram of the limit value change unit 108 according to a sixth embodiment of the present invention. In the present embodiment, the limit value change unit 108 further includes a selection circuit 1084 in addition to the limit parameter setting unit 1081 and the first limit value calculation unit 1082 described in the fourth embodiment and the second limit value calculation unit 1083 described in the fifth embodiment as illustrated in FIG. 13.

In the present embodiment, the limit parameter setting unit 1081, the first limit value calculation unit 1082, and the second limit value calculation unit 1083 perform the same operations as those described in the fifth embodiment. That is, the limit parameter setting unit 1081 sets the two types of limit parameters $P_1$ and $P_2$. The first limit value calculation unit 1082 calculates the limit values $L_{1A}$ and $L_{2A}$ based on the divergence amount Z and the limit parameter $P_1$, and outputs the calculated values as the first limit value set. The second limit value calculation unit 1083 calculates the limit values $L_{1B}$ and $L_{2B}$ based on the divergence amount Z and the limit parameter $P_2$, and outputs the calculated values as the second limit value set.

The selection circuit 1084 selects a limit value included in either of the first limit value set or the second limit value set for each of the plurality of types of control parameters based on a selection signal SEL output from the charge/discharge control unit 102. Specifically, the selection circuit 1084 selects either the limit value $L_{1A}$ of the first limit value set or the limit value $L_{1B}$ of the second limit value set, and also selects either the limit value $L_{2A}$ of the first limit value set or the limit value $L_{2B}$ of the second limit value set. Further, the selected limit value $L_{1A}$ or limit value $L_{1B}$ is output as a selected limit value $L_1$ to the charge/discharge control unit 102, and the selected limit value $L_{2A}$ or limit value $L_{2B}$ is output as a selected limit value $L_2$ to the charge/discharge control unit 102.

The charge/discharge control unit 102 outputs the selection signal SEL to the selection circuit 1084, and controls the charge/discharge current of the storage battery 101 using the selected limit value $L_1$ and limit value $L_2$ output from the selection circuit 1084 according to the selection signal SEL. At this time, the charge/discharge control unit 102 can select any one of the first limit value set and the second limit value set to be used according to various conditions such as a state of a battery load, a request of a use, and an operation mode of the battery management device 100, similarly to the description in the fifth embodiment, and output the selection signal SEL in accordance with a result of the selection.

According to the sixth embodiment of the present invention described above, the following operational effect is further achieved in addition to the effects of (1) and (2) described in the fourth embodiment and the operational effect of (3) described in the fifth embodiment.

Figure 14:
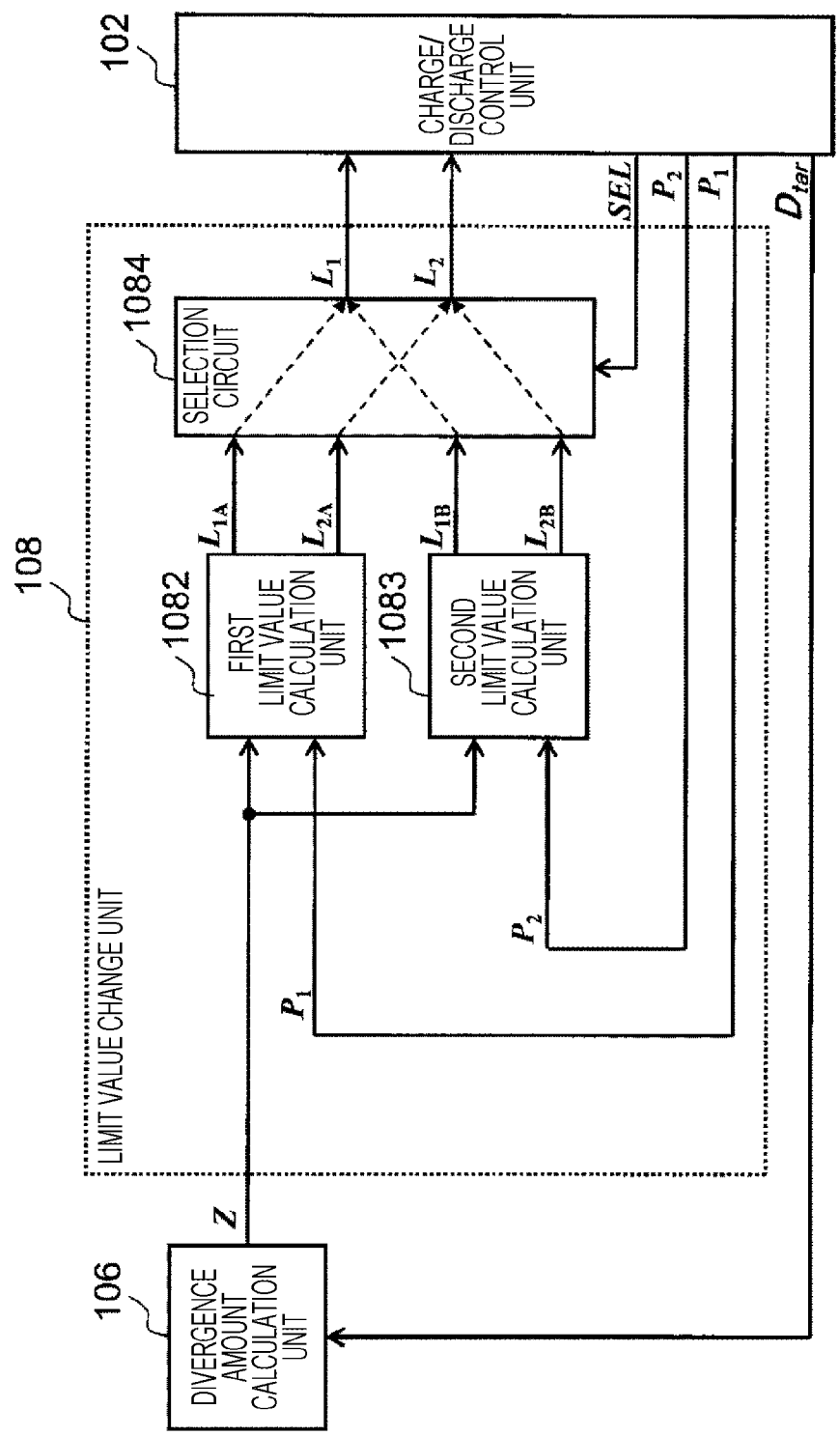
FIG. 14 is a control block diagram of a limit value change unit according to a seventh embodiment of the present invention.

(4) The limit value change unit 108 further includes the selection circuit 1084 that selects the charge/discharge limit value included in either the first limit value set or the second limit value set for each of the plurality of types of control parameters. In this manner, it is possible to utilize an appropriate limit value on battery performance according to a situation while securing the battery life with respect to the users having different magnitudes of battery loads Seventh Embodiment FIG. 14 is a control block diagram of the limit value change unit 108 according to a seventh embodiment of the present invention. In the present embodiment, the limit value change unit 108 includes the first limit value calculation unit 1082, the second limit value calculation unit 1083, and the selection circuit 1084, but does not include the limit parameter setting unit 1081 as illustrated in FIG. 14.

In the present embodiment, the operation of the limit parameter setting unit 1081 as described in the fifth embodiment is performed in the charge/discharge control unit 102. That is, the charge/discharge control unit 102 sets the two types of limit parameters $P_1$ and $P_2$, and outputs these limit parameters to the first limit value calculation unit 1082 and the second limit value calculation unit 1083, respectively. Further, the charge/discharge control unit 102 calculates the above-described degradation amount target value $D_{tar}$ for the storage battery 101, and outputs the calculated value to the divergence amount calculation unit 106. For example, it is possible to use a charge state, a charge state change rate, an internal resistance value, an internal resistance change rate, and the like in the storage battery 101 after a lapse of a predetermined period, set as a life target value, as the degradation amount target value $D_{tar}$. That is, the degradation amount target value $D_{tar}$ can be set as a value including at least one of these values.

The divergence amount calculation unit 106 calculates divergence amount Z based on the degradation amount target value $D_{tar}$ from the charge/discharge control unit 102 and outputs the calculated divergence amount to the first limit value calculation unit 1082 and the second limit value calculation unit 1083. The first limit value calculation unit 1082 calculates the limit values $L_{1A}$ and $L_{2A}$ based on the divergence amount Z from the divergence amount calculation unit 106 and the limit parameter $P_1$ from the charge/discharge control unit 102, and outputs these calculated limit values as the first limit value set. The second limit value calculation unit 1083 calculates the limit values $L_{1B}$ and $L_{2B}$ based on the divergence amount Z from the divergence amount calculation unit 106 and the limit parameter $P_2$ from the charge/discharge control unit 102 and outputs these calculated limit values as the second limit value set.

The selection circuit 1084 selects either the limit value $L_{1A}$ of the first limit value set or the limit value $L_{1B}$ of the second limit value set, and also selects either the limit value $L_{2A}$ of the first limit value set or the limit value $L_{2B}$ of the second limit value set similarly to the description in the sixth embodiment, based on the selection signal SEL output from the charge/discharge control unit 102. Further, the selected limit value $L_{1A}$ or limit value $L_{1B}$ is output as a selected limit value $L_1$ to the charge/discharge control unit 102, and the selected limit value $L_{2A}$ or limit value $L_{2B}$ is output as a selected limit value $L_2$ to the charge/discharge control unit 102.

According to the seventh embodiment of the present invention described above, the following operational effect is further achieved in addition to the effect of (1) described in the fourth embodiment.

(5) The limit value change unit 108 further includes: the second limit value calculation unit 1083 that calculates the second limit value set, different from the first limit value set and obtained by combining the charge/discharge limit values for each of the plurality of types of control parameters, based on the divergence amount Z; and the selection circuit 1084 that selects the charge/discharge limit value included in either the first limit value set or the second limit value set for each of the plurality of types of control parameters. The first limit parameter $P_1$ and the second limit parameter $P_2$, each of which is configured to determine the weighting for each of the plurality of types of control parameters, are input from the charge/discharge control unit 102 to the limit value change unit 108. The first limit value calculation unit 1082 calculates the first limit value set based on the divergence amount Z and the input first limit parameter $P_1$. The second limit value calculation unit 1083 calculates the second limit value set based on the divergence amount Z and the input second limit parameter $P_2$. In this manner, it is possible to utilize an appropriate limit value on battery performance according to a situation while securing the battery life with respect to the users having different magnitudes of battery loads Although various embodiments have been described as described above, the present invention is not limited to these contents. Other modes conceivable within the technical idea of the present invention are also included in the scope of the present invention. In addition, the respective embodiments and modifications thereof described above can be arbitrarily combined with each other.

REFERENCE SIGNS LIST 1 battery system
100 battery management device
101 storage battery
102 charge/discharge control unit
103 battery information acquisition unit
104 history storage unit
105 life prediction unit
106 divergence amount calculation unit
107 life target value storage unit
108 limit value change unit
109 control unit
201 display device
202 input device
203 power control unit
204 engine control unit
205 motor/generator
206 engine
207 power split mechanism
208 drive wheel
209 user
1081 limit parameter setting unit
1082 first limit value calculation unit
1083 second limit value calculation unit
1084 selection circuit

The invention claimed is:
1. A battery management device comprising:
a divergence amount calculation unit that calculates a divergence amount between a life target value or a degradation amount target value of a secondary battery, and a life prediction value or a degradation amount prediction value according to use history of the secondary battery in an arbitrary period from past to present; and
a limit value change unit that changes a charge/discharge limit value for each of a plurality of types of control parameters for controlling degradation of the secondary battery to increase a degradation progression rate when the divergence amount exceeds a threshold, wherein the limit value change unit includes:

a limit parameter setting unit sets a first limit parameter and a second limit parameter as limit parameters, the limit parameters determine weighting for each of the plurality of types of control parameters each of which changes in correlation with each other, a first limit value calculation unit that calculates a first limit value set, obtained by combining the first limit parameter and the charge/discharge limit value for each of the plurality of types of control parameters, a second limit value calculation unit that calculates a second limit value set, different from the first limit value set and obtained by combining the second limit parameter and the charge/discharge limit value for each of the plurality of types of control parameters.

2. The battery management device according to claim 1, wherein the limit value change unit further comprises a selection circuit that selects the charge/discharge limit value included in either the first limit value set or the second limit value set for each of the plurality of types of control parameters.

3. A battery system comprising:

the battery management device according to claim 2;

the secondary battery managed by the battery management device; and a charge/discharge control unit that controls a charge/discharge current of the secondary battery based on the charge/discharge limit value selected by the selection circuit.

4. The battery management device according to claim 1, wherein the first limit value set includes at least an allowable current value during charge/discharge of the secondary battery and a central charge state during charge/discharge of the secondary battery.

5. The battery management device according to claim 1, wherein each of the first limit value set and the second limit value set includes a charge/discharge limit value for a first control parameter and a charge/discharge limit value for a second control parameter, the charge/discharge limit value for the first control parameter of the second limit value set is larger than the charge/discharge limit value for the first control parameter of the first limit value set, and the charge/discharge limit value for the second control parameter of the second limit value set is smaller than the charge/discharge limit value for the second control parameter of the first limit value set.

6. The battery management device according to claim 1, wherein the degradation amount target value includes at least one of a charge state, a charge state change rate, an internal resistance value, and an internal resistance change rate of the secondary battery after a lapse of predetermined period.

7. The battery management device according to claim 1, further comprising:

a history storage unit that stores a battery use condition calculated based on any one or more of a voltage, a current, temperature, and a stored electricity amount of the secondary battery in an arbitrary period from the past to the present;

a life target value storage unit that stores the life target value when the secondary battery is used until reaching the degradation amount target value or the degradation amount target value when the secondary battery is used until reaching the life target value; and a life prediction unit that predict any one or more of the life prediction value when the secondary battery is used until reaching the degradation amount target value with the charge/discharge limit value and the battery use condition and the degradation amount prediction value at a timing of the life target value, wherein the divergence amount calculation unit calculates any one or more of a divergence amount between the stored life target value and the predicted life prediction value and a divergence amount between the stored degradation amount target value and the predicted degradation amount prediction value, as the divergence amount.

8. A battery system comprising:

the battery management device according to claim 1;

a secondary battery managed by the battery management device; and a charge/discharge control unit that controls a charge/discharge current of the secondary battery based on the first limit value set calculated by the limit value change unit.

9. A hybrid vehicle control system comprising:

an engine and a motor provided via a power split mechanism; and the battery system according to claim 8, wherein each driving force distribution of the engine and the motor is controlled according to control of the charge/discharge current performed by the charge/discharge control unit.

10. The battery management device according to claim 1, wherein when the divergence amount does not exceed an other threshold the charge/discharge limit value is changed to decrease the degradation progression rate.

11. The battery management device according to claim 10, wherein the other threshold is 1.

* * * * *